(12) United States Patent
Henninger et al.

(10) Patent No.: US 7,274,077 B2
(45) Date of Patent: Sep. 25, 2007

(54) TRENCH TRANSISTOR

(75) Inventors: Ralf Henninger, Munich (DE); Franz Hirler, Isen (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 11/067,500

(22) Filed: Feb. 25, 2005

(65) Prior Publication Data

US 2005/0194629 A1    Sep. 8, 2005

(30) Foreign Application Priority Data

Feb. 27, 2004   (DE) ...................... 10 2004 009 602

(51) Int. Cl.
*H01L 29/94*   (2006.01)

(52) U.S. Cl. ...................... 257/409; 257/170; 257/302; 257/484; 257/E29.013

(58) Field of Classification Search .................. 257/409
See application file for complete search history.

(56) References Cited

U.S. PATENT DOCUMENTS

| 6,388,286 B1 | 5/2002 | Baliga |
| 2003/0047777 A1 | 3/2003 | In't Zandt et al. |
| 2004/0238884 A1* | 12/2004 | Tanaka et al. ............... 257/341 |

FOREIGN PATENT DOCUMENTS

| DE | 101 27 885 A1 | 12/2002 |
| WO | WO2000/42665 A1 | 7/2000 |

* cited by examiner

*Primary Examiner*—Tu-Tu Ho
(74) *Attorney, Agent, or Firm*—Maginot Moore & Beck

(57) ABSTRACT

A trench transistor has a cell array, in which at least one cell array trench (2) is provided, and an edge structure framing the cell array. An edge trench (15) spaced apart from the cell array trenches (2) is provided in the edge structure.

20 Claims, 7 Drawing Sheets

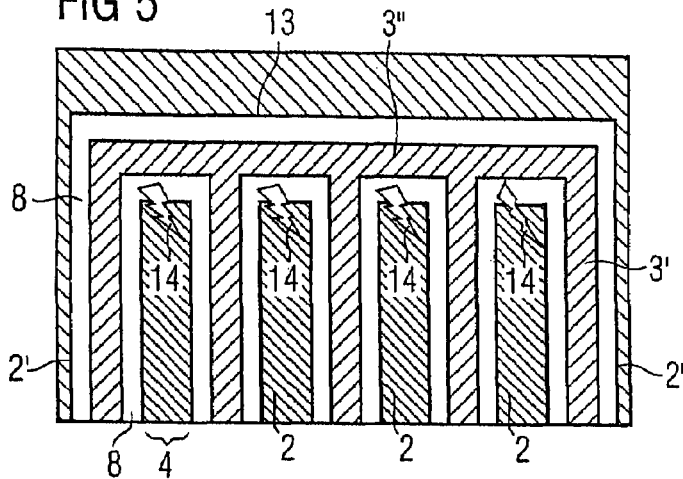
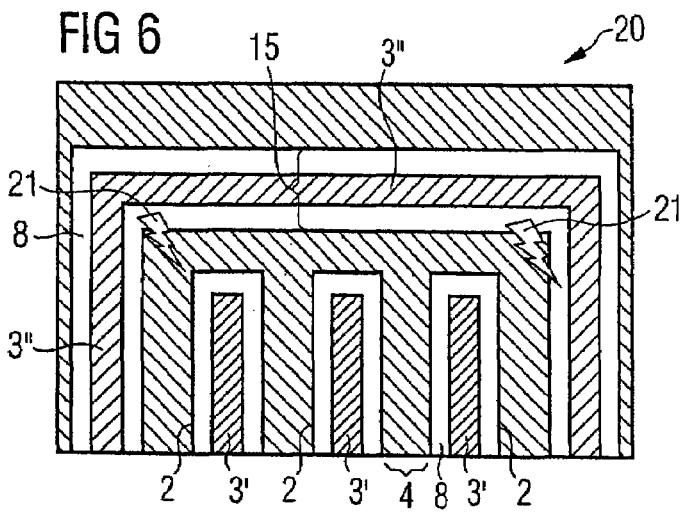
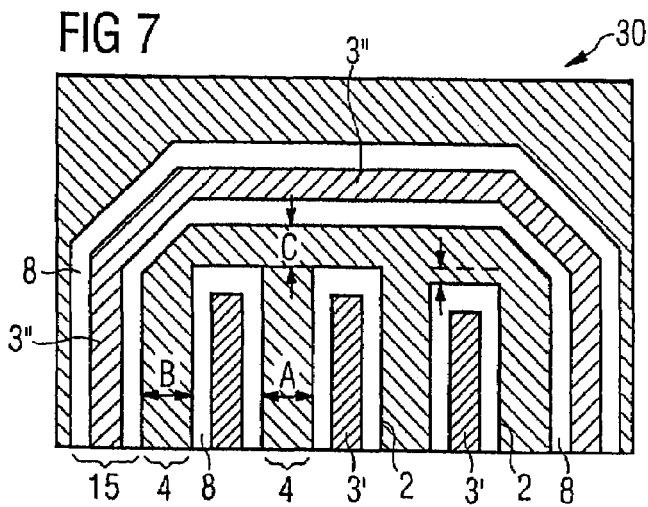

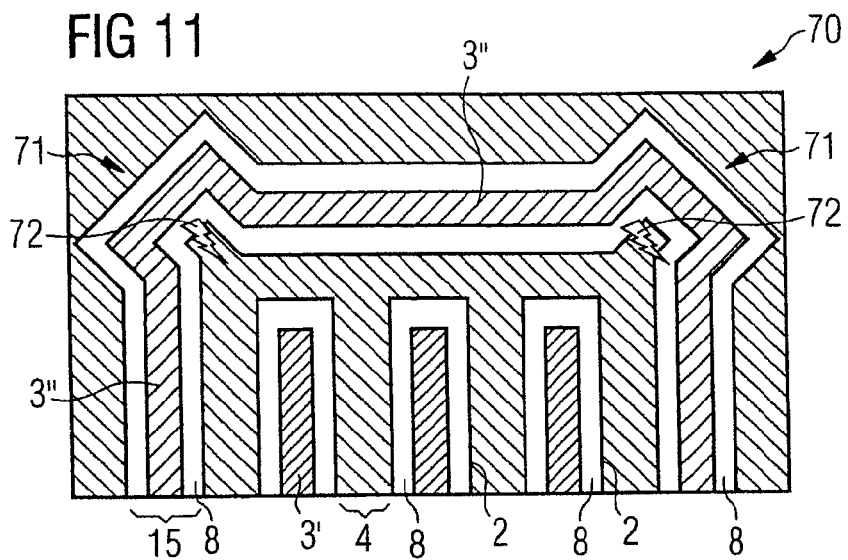
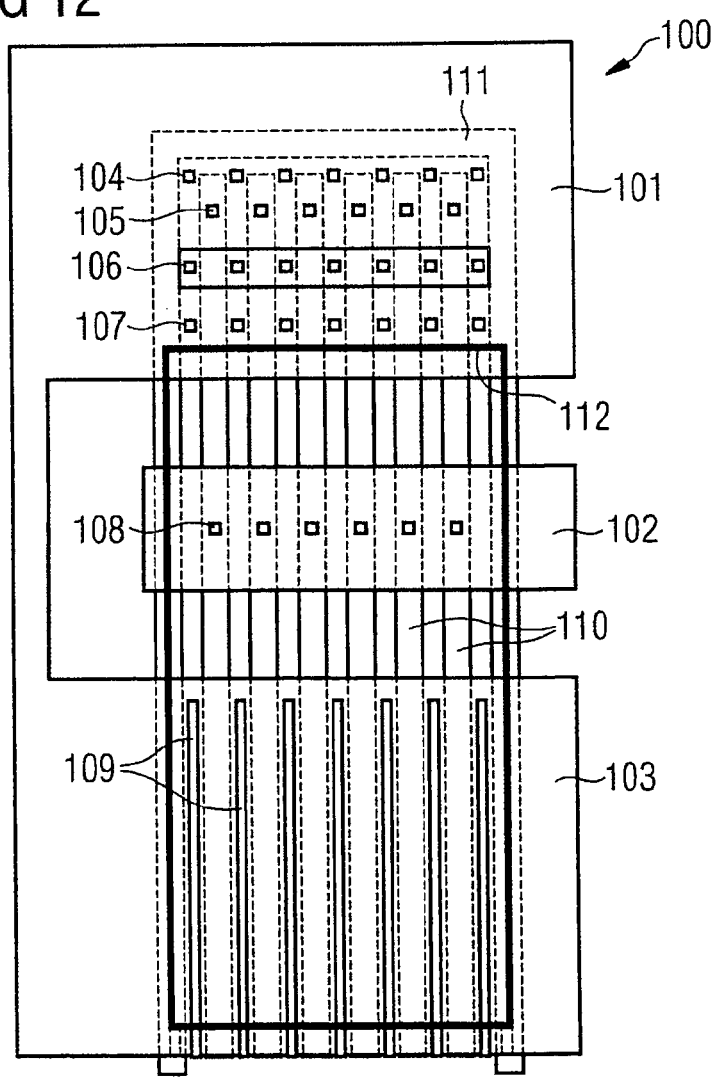

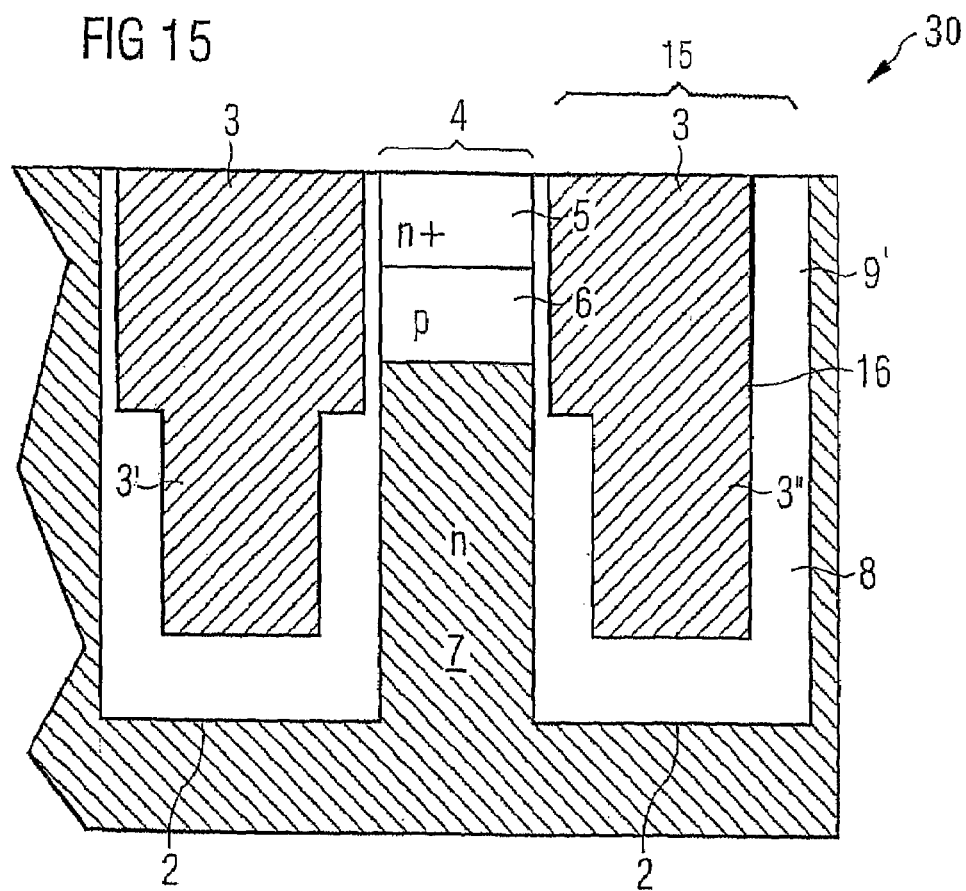

TRENCH TRANSISTOR

BACKGROUND

The invention relates to a trench transistor.

An important characteristic quantity of semiconductor components is their on resistance. A reduction of the on resistance generally entails a lowering of the fabrication costs since, with performance data remaining the same, the dimensions of the semiconductor component can be decreased.

In practice, however, it is often necessary to dispense with optimizing the on resistance since measures that oppose a lowering of the on resistance are often implemented in order to safeguard specific properties of the semiconductor components.

The problem area described above shall be explained again by way of example below with reference to FIGS. 1 to 5.

FIG. 2 shows a construction (illustrated in simplified fashion) of a trench transistor 1 in a cross-sectional illustration. The detail from this trench transistor 1 that can be seen in FIG. 2 has a first and a second trench (cell array trench) 2, into which a gate electrode 3 and a field electrode 3' are in each case introduced, a mesa region 4 situated between the cell array trenches 2, said mesa region having an n$^+$-doped source region 5, a p-doped body region 6 and an n-doped drift region 7, and also field oxide layers 8 and gate oxide layers 9 enclosing the gate electrode 3 and the field electrode 3'. The gate electrode 3 is generally electrically insulated (not shown here) from the field electrode 3'. Charges present in the drift zone 7 are for the most part compensated for by the field electrodes 3'. As a result of such compensation, in accordance with the dependence on the distance between the cell array trenches 2, the drift zone 7 can still be depleted despite high doping, whereby the blocking capability of the trench transistor 1 is improved.

As soon as field electrodes are provided in an additional trench in the edge region of the trench transistor 1, said additional trench being configured with the same or approximately the same depth as the cell array trenches 2, in order to block the penetration of edge leakage currents into the cell array, excessive field increases that lower the breakdown voltage are generated at the corners at which the trench bottoms meet. This problem area is illustrated in FIG. 5.

FIG. 4 shows an example of an "open" chip design in plan view. The illustration shows a plurality of trenches 2, into each of which a field electrode 3' and field oxide layers 8 and also gate electrodes 3 and gate oxide layers 9 (which cannot be seen) are introduced. The section in FIGS. 4-11 runs along a plane which, with regard to FIGS. 2 and 3, runs perpendicular to the plane of the drawing in horizontal orientation and intersects the regions 8, 3' and 4 ("deepened plan view"). The upper part in FIG. 5 shows a part of the edge of the chip design and the lower part in FIG. 5 shows a part of the cell array or cell array edge of the chip design. In this case, the middle trench 2 symbolizes one or a plurality of cell array trenches (that is to say that a plurality of cell array trenches may also be provided) and the trenches 2' provided on the left and on the right of the middle cell array trench 2 symbolize edge trenches in each case. The advantage of this chip design is an avalanche breakdown distributed uniformly over the cell array of the trench transistor 1. What is disadvantageous about such a chip design is that leakage currents can penetrate unimpeded into the mesa regions 4 from the edge region of the trench transistor 1, as is indicated by the arrows denoted by reference numeral 12. A further disadvantage is that a dedicated mask is required for fabricating the body region in the edge region of the chip design.

As is shown in FIG. 5, such leakage currents can be avoided by means of an additional transverse trench 13, which runs perpendicular to the rest of the trenches 2, 2' and the field electrode 3" of which is connected to the end sides of the field electrodes 3' of the trenches 2, 2'. What is disadvantageous in this case, however, in turn is that lower breakdown voltages occur in the edge region, that is to say at the interface between the trenches 2, 2' and the transverse trench 13, and so the avalanche breakdown occurs at lower voltages in this region, which is symbolized by the arrows denoted by reference numeral 14: a breakdown voltage that is approximately 30% lower than within the cell array occurs at the ends (end sides) of the mesa regions 4.

The lowering of the breakdown voltage that is brought about by the transverse trench can be compensated for, as already mentioned, by the provision of reserves in the breakdown voltage, e.g. through larger epitaxial thickness and trench depth. The breakdown ("avalanche breakdown") is nevertheless effected locally, for example in the region of the transverse trench of the trench transistor in FIG. 5. A large part of the energy of the avalanche breakdown pulse would thus also be dissipated in this areally limited edge volume, which, without further cost-intensive countermeasures, would lead to premature destruction of the trench transistor. Moreover, the provision of such reserves entails an increase in the on resistance. The introduction of a transverse trench 13, as shown in FIG. 5, has a similar effect to decreasing the mesa width, on account of the additional charge depletion brought about by the field plates, and leads to the lowering of the breakdown voltage.

FIG. 1 shows the breakdown voltage of a trench transistor having a small trench spacing as a function of the width of the mesa regions (semiconductor regions between the cell array trenches). FIG. 1 clearly shows that, in the case of trench transistors having a small trench spacing ("dense trench regime"), the breakdown voltage rises as the trench spacing increases, that is to say as the width of the mesa regions increases. Conventional trench transistors having a significantly larger trench spacing exhibit the opposite behavior.

When high voltages are present, in the case of trench transistors having a small trench spacing, the avalanche breakdown takes place in the region of the bottoms of the trenches 2, 2', as is symbolized by the arrow denoted by reference numeral 10 in FIG. 2. In contrast to this, as is shown in FIG. 3, in the case of a trench transistor 1' having a large trench spacing, the avalanche breakdown takes place principally within the body region 6, which is indicated by the arrow denoted by reference numeral 11.

The object on which the invention is based is to specify a trench transistor by means of which it is possible to block leakage currents from an edge region of the trench transistor into the cell array, and at the same time it is possible to prevent a local lowering of the breakdown voltage in the edge region of the cell array, so that the provision of reserves becomes superfluous.

SUMMARY

The trench transistor according to the invention has a cell array, in which at least one cell array trench is provided, and an edge structure framing the cell array. An edge trench spaced apart from the cell array trenches is provided in the edge structure.

In this way, it is possible to shield against edge leakage currents and at the same to extend the breakdown region to the entire chip area.

In a preferred embodiment, the cell array trenches essentially run parallel to one another. In this case, it is advantageous for a distance A, by which the cell array trenches are spaced apart from one another, a distance B between the longitudinal sides of the two outermost cell array trenches and the edge trench, and a distance C between the edge trench and the end sides of the cell array trenches to be chosen in such a way that the following relation is fulfilled: A<=B, A<=C. As an alternative or in addition, the following relation preferably holds true: A<=B<=C.

The lengths of the cell array trenches do not have to be identical. By way of example, the lengths of the two outermost cell array trenches may be shortened compared with the lengths of the rest of the cell array trenches.

In a preferred embodiment, parts of the edge trench opposite the end sides of the mesa regions and/or the end sides of the cell array trenches in each case have slight bulges (referred to hereinafter (in exaggerated fashion) as "V-shaped configuration"), the tips of the V-shaped configurations running toward the corresponding end sides of the mesa regions/cell array trenches.

As an alternative to this, parts of the edge trench opposite the end sides of the mesa regions and/or the end sides of the cell array trenches may in each case have slight bulges ("a V-shaped configuration"), the tips of the V-shaped configurations running away from the respective end sides of the mesa regions/cell array trenches. Such embodiments may be used for example to compensate for (small) fluctuations in the local breakdown voltage that are the consequence of segregation effects of dopants (accumulation or depletion during oxidative process steps).

The principle of the invention can be applied particularly advantageously to field plate trench transistors, in particular to field plate trench transistors in the so-called "dense trench regime", which are distinguished by the fact that their breakdown voltage increases the further the trenches are spaced apart from one another.

Preferably, the edge trench is closed and runs around the entire cell array. This is not absolutely necessary, however. The edge trench advantageously has no right angles, since a local reduction of the breakdown voltage and thus an inhomogeneous breakdown distribution can be prevented in this way. Instead, bulges are preferably provided in parts of the edge trench opposite the corners of the cell array in order to avoid the right angles and thus the avalanche breakdowns.

The field electrode is thus preferably configured in the edge trench in such a way that excessive field increases are avoided.

By way of example, the field electrode may be connected to source potential or gate potential.

The cell array trenches are preferably uniformly spaced apart from one another. The uniform distance should in this case approximately correspond to the distance between the cell array trenches and the edge trench.

In an advantageous manner, a homogeneous insulation layer is provided at least on the inner wall of the edge trench that is remote from the cell array, said insulation layer being thicker than the thicknesses of the gate insulation layers (gate oxide layers) of the cell array trenches.

A further advantage of the trench transistor according to the invention is that the body region of the trench transistor is cut through by the edge trench, that is to say that, in the case of a closed edge trench, there cannot be a short circuit between the body region(s) included by the edge trench and the body region(s) excluded by the edge trench. It is thus possible to save a mask (body mask) during the fabrication process for the trench transistor.

The invention therefore provides a method for fabricating the trench transistor according to the invention, which method is characterized by the fact that the fabrication of the body region/body regions is effected without a mask (over the whole area). The mask that would otherwise be required is replaced by the provision of the edge trench that separates the body region into an edge part and a cell array part.

BRIEF DESCRIPTION OF THE DRAWINGS

The invention is explained in more detail below in exemplary embodiment with reference to the figures, in which:

FIG. 5 shows a plan view of a detail from a further trench transistor in accordance with the prior art.

FIG. 6 shows a plan view of a first embodiment of the trench transistor according to the invention.

FIG. 7 shows a plan view of a second embodiment of the trench transistor according to the invention.

FIG. 11 shows a plan view of a sixth embodiment of a trench transistor according to the invention.

FIG. 12 shows a first contact-making arrangement for making contact with the trench transistor according to the invention.

FIG. 15 shows a cross sectional view of an alternative embodiment of the trench transistor of FIG. 7.

In the figures, identical or mutually corresponding figures are denoted by the same reference numerals.

It is thus an aim to specify, for a field plate trench with a breakdown location at the trench bottom (dense trench), an edge design which at all points has a higher breakdown voltage than within the cell array.

Gate rings or channel stoppers are not shown in the figures.

DESCRIPTION

The embodiments of the trench transistor according to the invention that are shown in FIGS. 6 to 14 can be used both for homogenization and for defined local variation of the breakdown voltage over the chip area of a trench field plate transistor having a small trench spacing (dense field plate trench transistor). The figures in each case show plan views of a part of the edge layout.

Figure 1:
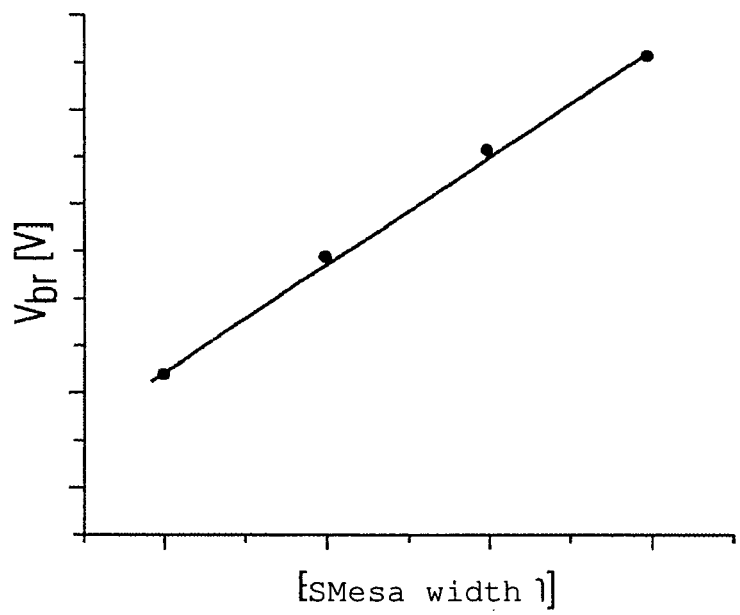
FIG. 1 shows the relationship between breakdown voltage and mesa width in a trench transistor having a small trench spacing (in relative units).
Figure 2:
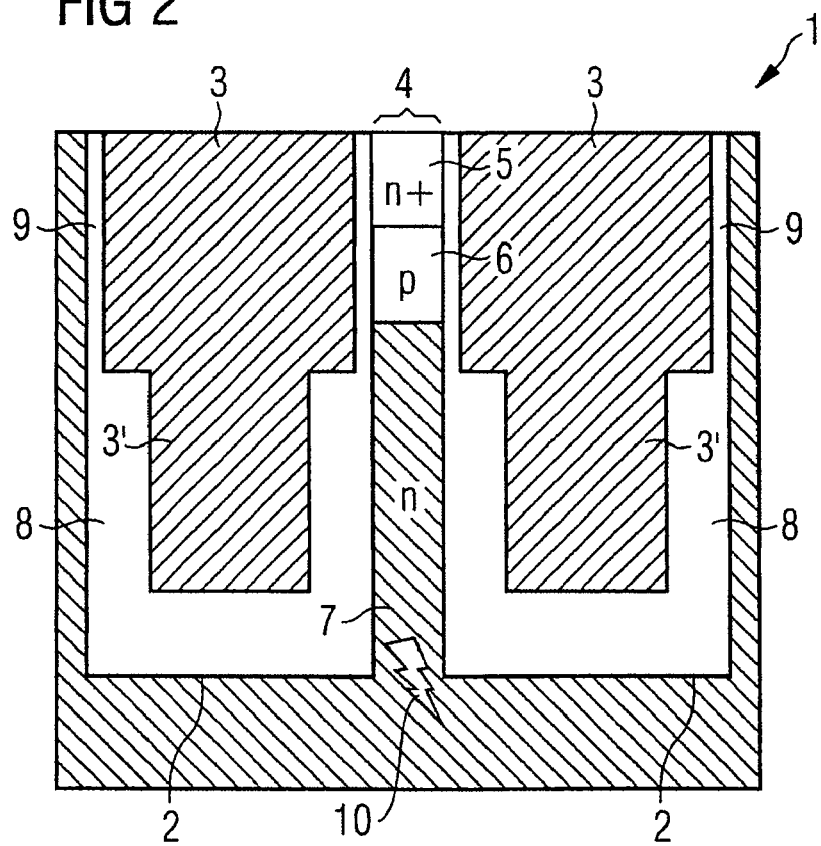
FIG. 2 shows a cross-sectional illustration of a detail from a trench transistor having a small trench spacing.
Figure 3:
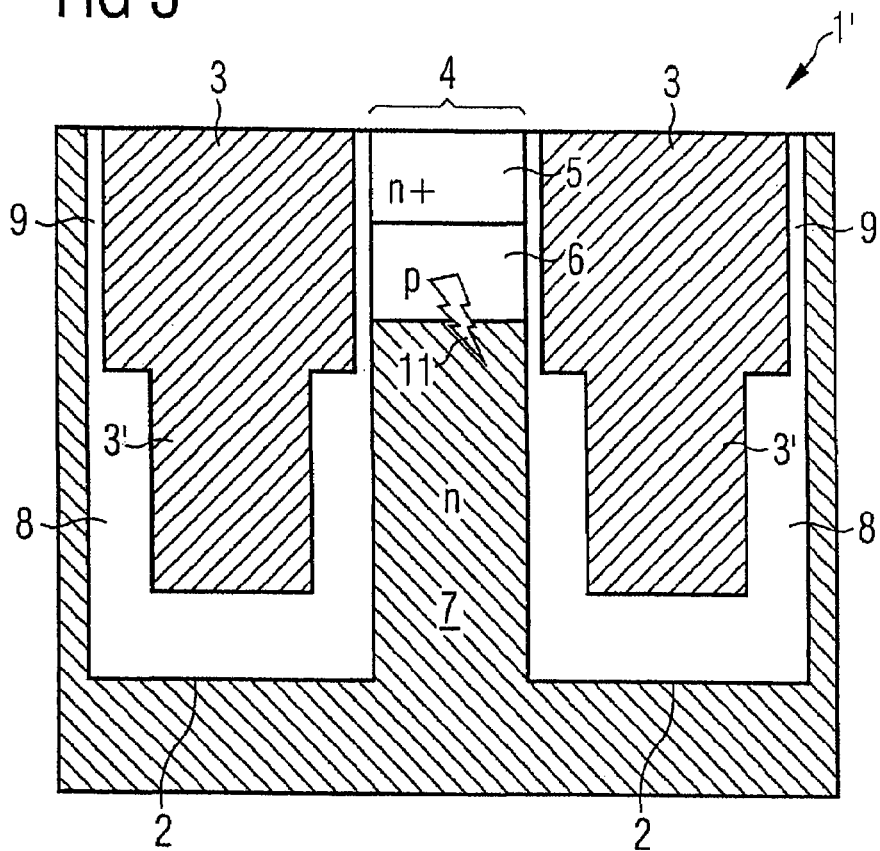
FIG. 3 shows a cross-sectional illustration of a detail from a trench transistor having a large trench spacing.
Figure 4:
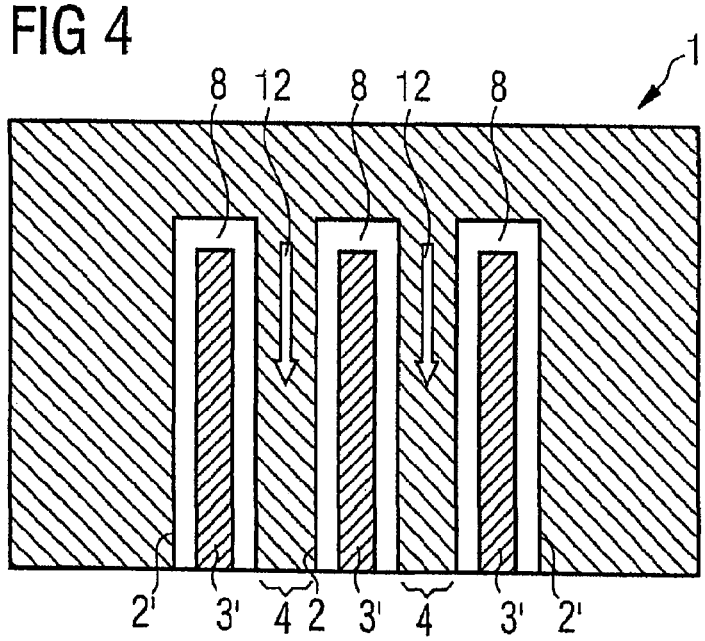
FIG. 4 shows a plan view of a detail from a trench transistor in accordance with the prior art.

The first embodiment 20 shown in FIG. 6 differs from the trench transistor shown in FIG. 4 by the fact that the cell array trenches 2 are framed by an edge trench 15, the edge trench 15 being spaced apart from the cell array trenches 2. The cell array trenches 2 are therefore not directly connected to the edge trench 15, which is the case for example in the embodiment shown in FIG. 5, where the cell array trenches 2 and also the transverse trench 13 form a "unit". The field electrodes 3' provided in the cell array trenches 2 and also the field electrode 3" provided in the edge trench 15 are advantageously electrically connected to one another (by a corresponding contact-making arrangement, see FIG. 13). The edge trench 15 can accordingly isolate an edge region from body regions at source potential.

The provision of the spaced-apart edge trench 15 makes it possible to bring about a homogeneous distribution of the avalanche breakdown across the entire cell array. Only in the corner regions of the edge trench 15 is the probability of an avalanche breakdown increased since, on account of the right angles of the edge trench 15 that occur there, equipotential lines run in the corners and form excessive field increases that lower the breakdown voltage, which is symbolized by the arrows denoted by reference numeral 21.

In order to avoid the lowering of the breakdown voltage in the corners of the edge trench 15, the edge trench 15, in the second embodiment 30 shown in FIG. 7, is "beveled" in the corners, that is to say has no right angles. Furthermore, FIG. 7 illustrates that the cell array trenches 2 need not necessarily have the same length. By way of example, the outermost cell array trenches can be shortened in their length. This is equally possible for the inner cell array trenches as well. As is indicated in the second embodiment 30, a distance A, by which the cell array trenches are spaced apart from one another, a distance B between the longitudinal sides of the two outermost cell array trenches and the edge trench, and a distance C between the edge trench and the end sides of the cell array trenches fulfill the following relation: A<=B<=C. Given a sufficiently small trench spacing (dense trench regime), the breakdown voltage decreases with a reduction of the trench spacing. The relation A<=B<=C ensures that the avalanche breakdown takes place in a manner distributed homogeneously over the cell array.

Figure 8:
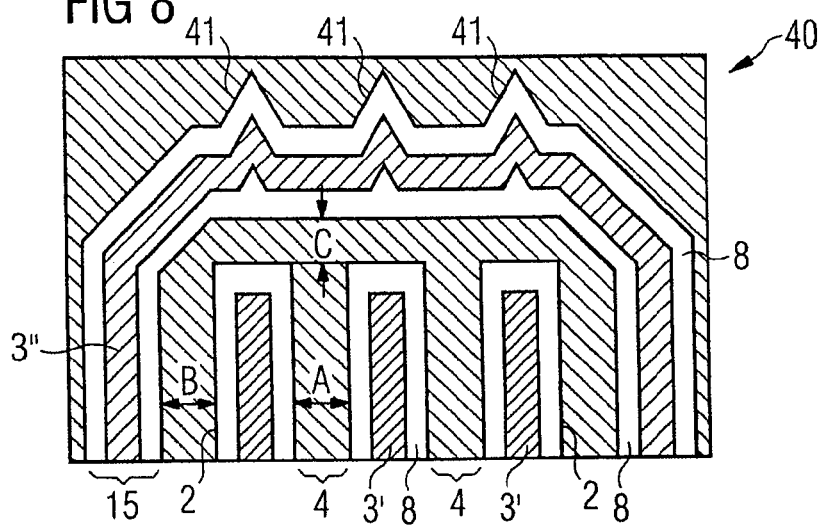
FIG. 8 shows a plan view of a third embodiment of the trench transistor according to the invention.
Figure 9:
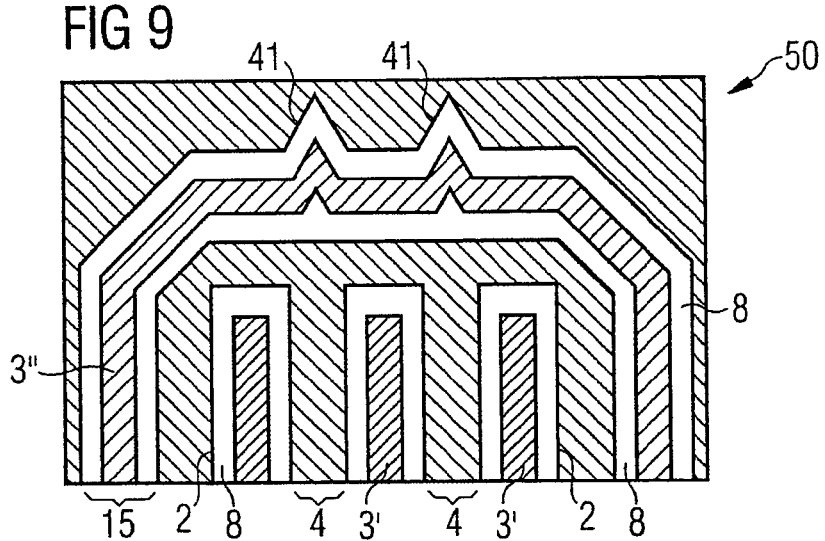
FIG. 9 shows a plan view of a fourth embodiment of a trench transistor according to the invention.

In the third embodiment 40 shown in FIG. 8, slight bulges ("V-shaped tips 41" (depicted in exaggerated fashion)) are provided in the parts of the edge trench 15 opposite the end sides of the cell array trenches 2, which bulges run away from the end sides of the cell array trenches. Analogously to this, as is illustrated in the fourth embodiment 50 shown in FIG. 9, the "tips" 41 may also be provided in the parts of the edge trench 15 opposite the end sides of the mesa regions 4.

Figure 10:
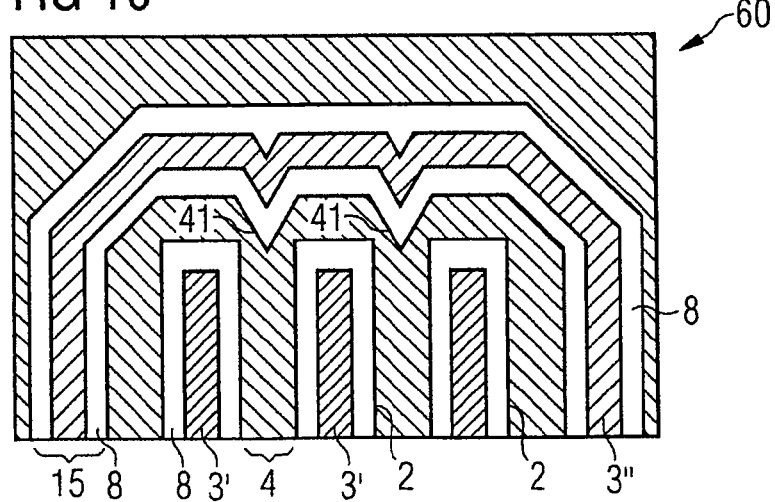
FIG. 10 shows a plan view of a fifth embodiment of a trench transistor according to the invention.

As is illustrated in the fifth embodiment 60 shown in FIG. 10, the V-shaped "tips" (generally the maxima of the bulges) 41 may also run toward the end sides of the mesa regions 4 or the cell array trenches 2.

In a sixth embodiment 70 shown in FIG. 11, bulges ("ears") 71 are provided in the corners of the edge trench 15. The bulges are depicted with their size exaggerated and may also be configured in round fashion.

In the embodiments shown in FIGS. 6 to 11, the local value of the breakdown voltage in the chip corners or in the chip edge is accordingly controlled by local variation of the distance between the cell array trenches 2 or the mesa regions 4 and the peripheral edge trench 15 or by local variation in the form of the edge trench 15 (bulges in the corners of the edge trench 15 or V-shaped trench routing opposite the end sides of the mesa regions 4 or the cell array trenches 2).

FIG. 12 shows a first contact-making arrangement 100 having a first metallization zone 101 for making contact with source and body regions or for making contact with field electrodes, a second metallization zone 102 serving for making contact with gate electrodes, and also a third metallization zone 103 serving for making contact with source regions of the active cell array.

The first contact-making arrangement 100 furthermore has first contact holes 104 for making contact with body regions, second contact holes 105 for making contact with a floating gate electrode, third contact holes 106 for making contact with the field electrode material, fourth contact holes 107 for making contact with body regions, fifth contact holes 108 for making contact with gate electrodes, and sixth contact holes 109 for making contact with source regions and also body regions.

The first contact-making arrangement 100 is distinguished by the fact that gate electrodes are connected directly in the trench, which makes it possible, in terms of process technology, to save a phototechnique. (No photopatterning of the gate electrode material is necessary). Furthermore, the cell array trenches, indicated by the bars denoted by reference numeral 110, are surrounded by an edge trench, indicated by the bar denoted by reference numeral 111. The frame denoted by reference numeral 112 indicates the boundary of the source region of the trench transistor. As already mentioned, a body/source mask can be dispensed with during the fabrication of the trench transistor according to the invention.

All the contact holes 104 to 109 described are connected to the corresponding overlying metallization zones 101 to 103, that is to say that the contact holes 104 to 109 are filled by the contact hole material, e.g. tungsten, polymaterial, or metal of the corresponding metallization zones 101 to 103.

Figure 13:
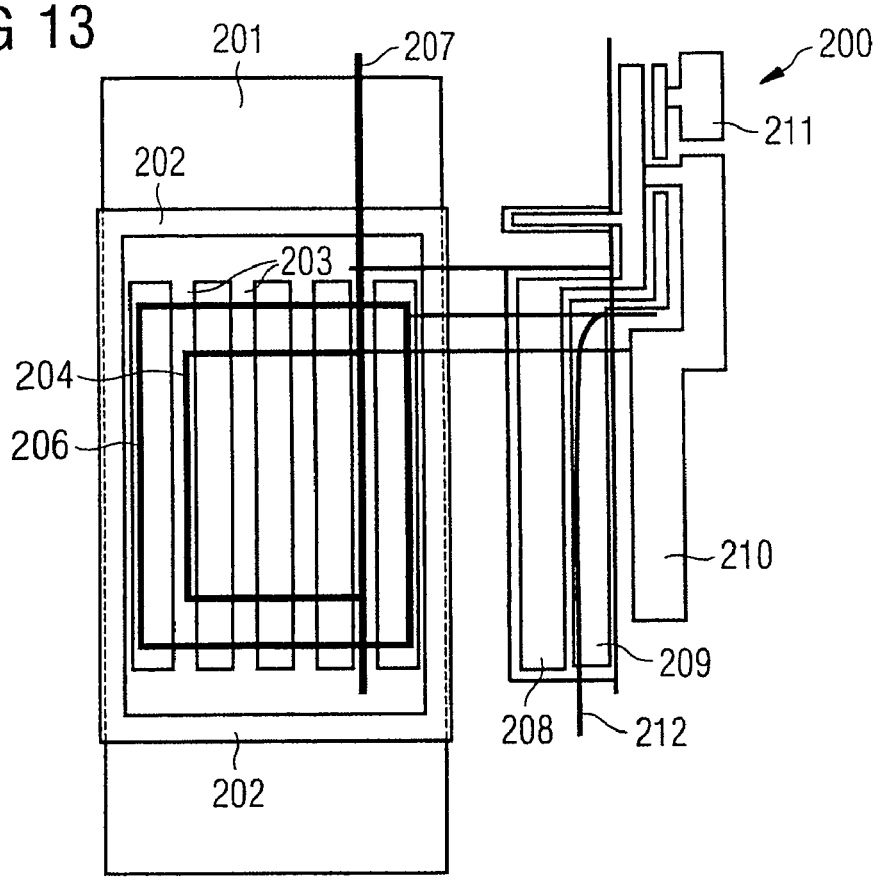
FIG. 13 shows a second contact-making arrangement for making contact with the trench transistor according to the invention.

FIG. 13 shows a second contact-making arrangement 200 for making contact with the trench transistor according to the invention. On the left, the illustration shows a plan view showing planar field plate electrode material 201, an edge trench 202, cell array trenches 203, a boundary of the source region 204 and a boundary of the gate region 206.

On the right-hand side, the illustration shows a cross section along the section plane marked by reference numeral 207. The illustration shows a field plate poly layer 208, a gate poly layer 209, and also a cell array metal layer 210 and a gate metal layer 211. The line denoted by reference numeral 212 indicates a pn junction between a body region and an epitaxial layer. The field plate poly layer 208 is a contiguous layer that electrically connects the field plates within the cell array trenches 203 to the field plate of the edge trench 202. The field plate poly layer 208 may be deposited in a single step.

Figure 14:
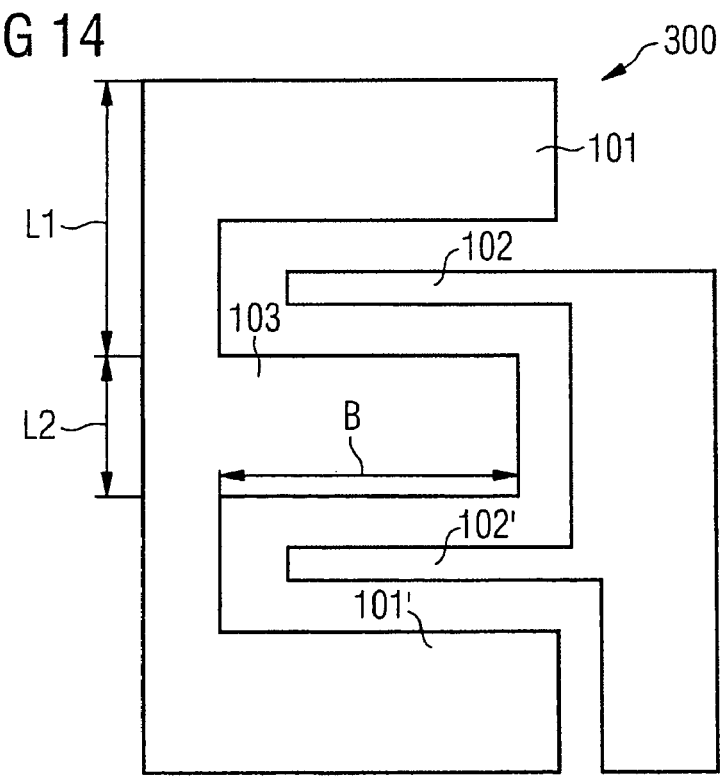
FIG. 14 shows a third contact-making arrangement for making contact with the trench transistor according to the invention.

FIG. 14 shows a metal contact layout 300 for making contact with the trench transistor according to the invention. The illustration shows the first metallization zone 101, already shown in FIG. 12, for connection of the field electrode material and the body regions in the edge, the second metallization zone 102 for making contact with the gate electrode material, under which a field electrode for electrical shielding is optionally laid in order to reduce the gate-drain capacitance, the third metallization zone 103 for making contact with the source regions of the cell array, and also a fourth metallization zone 102' and a fifth metallization zone 101'. The fourth and also the fifth metallization zones 102', 101' fulfill the same purpose as the second and first metallization zones 102, 101.

The first contact-making arrangement 100 shown in FIG. 12 thus shows a part of the metal contact layout 300 shown in FIG. 14. The dimensions of the metal contact layout 300 are arbitrary in principle. A length L1 of the edge construction may be 50 µm, for example, a length L2 of the scalable active chip area may be 3000 µm, for example, and a width B of the scalable active chip area may be 5000 µm, for example.

The gate oxide layers and field oxide layers may also be replaced by other insulation layers (other insulation layer materials).

In an advantageous manner, a homogeneous insulation layer 9' is provided at least on the inner wall 16 of the edge trench 15 that is remote from the cell array, said insulation layer 9' being thicker than the thicknesses of the gate insulation layers (gate oxide layers) of the cell array trenches. In the embodiments described above, the thin gate oxide layer 9 would thus be replaced by a thick field oxide layer 9' as shown in FIG. 15. This measure enables the dielectric strength of the trench transistor to be improved further. A thickened insulation layer may also be provided, of course, on the inner walls of the edge trench 15 that face the cell array.

LIST OF REFERENCE SYMBOLS 1, 1' Trench transistor
2 Cell array trench
2' Trench
3 Gate electrode
3', 3" Field electrode
4 Mesa region
5 Source region
6 Body region
7 Drift region
8 Field oxide layer
9 Gate oxide layer
10 Arrow
11 Arrow
12 Arrow
13 Transverse trench
14 Arrow
15 Edge trench
20 First embodiment
21 Arrow
30 Second embodiment
40 Third embodiment
41 Tips
50 Fourth embodiment
60 Fifth embodiment
70 Sixth embodiment
71 Bulges
72 Arrow
100 First contact-making arrangement
101 First metallization zone
101' Fifth metallization zone
102 Second metallization zone
102' Fourth metallization zone
103 Third metallization zone
104 First contact holes
105 Second contact holes
106 Third contact holes
107 Fourth contact holes
108 Fifth contact holes
109 Sixth contact holes
110 Cell array trench
111 Edge trench
112 Boundary of the source region
113 Boundary of the body region
200 Second contact-making arrangement
201 Field plate electrode material
202 Edge trench
203 Cell array trench
204 Boundary of the source region
205 Boundary of the body region
206 Boundary of the gate region
207 Section plane
208 Field plate poly layer
209 Gate poly layer
210 Cell array metal layer
211 Gate metal layer
212 pn junction body/epitaxial
300 Metal contact layout

The invention claimed is:

1. A trench transistor comprising:
a) a cell array including a plurality of cell array trenches; and
b) an edge structure framing the cell array, the edge structure including an edge trench spaced apart from the plurality of cell array trenches, wherein the plurality of cell array trenches run substantially parallel to one another, and wherein the plurality of cell array trenches comprise two outermost cell trenches, each of the plurality of cell array trenches comprise longitudinal sides and end sides, and the plurality of cell array trenches are spaced apart from one another by a distance A, a distance B is defined between the longitudinal sides of the two outermost cell array trenches and the edge trench, and a distance C is defined between the edge trench and the end sides of the cell array trenches, such that A<=B and A<=C, or A<=B<=C.

2. A trench transistor comprising:
a) a cell array including a plurality of cell array trenches; and
b) an edge structure framing the cell array, the edge structure including an edge trench spaced apart from the plurality of cell array trenches, wherein the plurality of cell array trenches run substantially parallel to one another, and wherein the plurality of cell array trenches comprise two outermost cell trenches, and the lengths of the two outermost cell array trenches are shorter than the lengths of the rest of the plurality of cell array trenches.

3. The trench transistor of claim 2 further comprising at least one mesa region between the plurality of cell array trenches, wherein parts of the edge trench opposite an end side of the at least one mesa region and/or opposite end sides of the plurality of cell array trenches include bulges running toward the end side of the at least one mesa region and/or toward the end sides of the plurality of cell array trenches.

4. The trench transistor of claim 2 further comprising at least one mesa region between the plurality of cell array trenches, wherein parts of the edge trench opposite an end side of the at least one mesa region and/or opposite end sides of the plurality of cell array trenches include bulges running away from the end side of the at least one mesa region and/or away from the end sides of the plurality of cell array trenches.

5. The trench transistor of claim 2 wherein the trench transistor is a field plate trench transistor.

6. The trench transistor of claim 2 wherein the edge trench is closed and runs around the entire cell array.

7. The trench transistor of claim 6 wherein the edge trench has no right angles.

8. The trench transistor of claim 2 wherein the cell array comprises corners and the edge trench includes bulges opposite the corners of the cell array.

9. The trench transistor of claim 2 wherein the plurality of cell array trenches are uniformly spaced apart from one another at a distance approximately corresponding to the distance between the plurality of cell array trenches and the edge trench.

10. A trench transistor comprising:
   a) a cell array including a plurality of cell array trenches; and
   b) an edge structure framing the cell array, the edge structure including an edge trench spaced apart from the plurality of cell array trenches, wherein the plurality of cell array trenches comprise gate insulation layers, the edge trench comprises an inner wall that is remote from the cell array, and a homogeneous insulation layer is provided at least on the inner wall of the edge trench, the insulation layer being thicker than the thicknesses of the gate insulation layers within the plurality of cell array trenches.

11. The trench transistor of claim 1 further comprising at least one mesa region between the plurality of cell array trenches, wherein parts of the edge trench opposite an end side of the at least one mesa region and/or opposite end sides of the plurality of cell array trenches include bulges running toward the end side of the at least one mesa region and/or toward the end sides of the plurality of cell array trenches.

12. The trench transistor of claim 1 further comprising at least one mesa region between the plurality of cell array trenches, wherein parts of the edge trench opposite an end side of the at least one mesa region and/or opposite end sides of the plurality of cell array trenches include bulges running away from the end side of the at least one mesa region and/or away from the end sides of the plurality of cell array trenches.

13. The trench transistor of claim 1 wherein the trench transistor is a field plate trench transistor.

14. The trench transistor of claim 1 wherein the edge trench is closed and runs around the entire cell array.

15. The trench transistor of claim 14 wherein the edge trench has no right angles.

16. The trench transistor of claim 1 wherein the cell array comprises corners and the edge trench includes bulges opposite the corners of the cell array.

17. The trench transistor of claim 10 further comprising at least one mesa region between the plurality of cell array trenches, wherein parts of the edge trench opposite an end side of the at least one mesa region and/or opposite end sides of the plurality of cell array trenches include bulges running toward the end side of the at least one mesa region and/or toward the end sides of the plurality of cell array trenches.

18. The trench transistor of claim 10 wherein the edge trench is closed and runs around the entire cell array.

19. The trench transistor of claim 18 wherein the edge trench has no right angles.

20. The trench transistor of claim 10 wherein the cell array comprises corners and the edge trench includes bulges opposite the corners of the cell array.

* * * * *